(12) United States Patent
Savas

(10) Patent No.: US 11,251,075 B2
(45) Date of Patent: Feb. 15, 2022

(54) SYSTEMS AND METHODS FOR WORKPIECE PROCESSING USING NEUTRAL ATOM BEAMS

(71) Applicants: Mattson Technology, Inc., Fremont, CA (US); Beijing E-Town Semiconductor Technology Co., Ltd., Beijing (CN)

(72) Inventor: Stephen E. Savas, Pleasanton, CA (US)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 0 days.

(21) Appl. No.: 16/055,685

(22) Filed: Aug. 6, 2018

(65) Prior Publication Data

US 2020/0043775 A1    Feb. 6, 2020

(51) Int. Cl.
| | |
|---|---|
| H01L 21/26 | (2006.01) |
| H01J 37/32 | (2006.01) |
| H01L 21/768 | (2006.01) |
| H01J 27/14 | (2006.01) |
| H01J 37/305 | (2006.01) |

(52) U.S. Cl.
CPC ........ *H01L 21/76826* (2013.01); *H01J 27/14* (2013.01); *H01J 37/3053* (2013.01)

(58) Field of Classification Search
CPC ..... H01L 21/2633; H01L 21/26; H01J 37/321
See application file for complete search history.

(56) References Cited

U.S. PATENT DOCUMENTS

| | | | |
|---|---|---|---|
| 4,140,576 A | 2/1979 | Fink et al. | |
| 4,975,572 A | 12/1990 | Rempt | |
| 5,818,040 A | 10/1998 | Kinoshita et al. | |
| 6,926,799 B2 | 5/2005 | Yeom et al. | |
| (Continued) | | | |

FOREIGN PATENT DOCUMENTS

CN        101236892 B        8/2008

OTHER PUBLICATIONS

Electromagnetic Radiation, Wikipedia, no date.*

(Continued)

*Primary Examiner* — Thomas T Pham
(74) *Attorney, Agent, or Firm* — Dority & Manning, P.A.

(57) ABSTRACT

Plasma processing systems and methods are provided. In one example, a system includes a processing chamber having a workpiece support. The workpiece is configured to support a workpiece. The system includes a plasma source configured to induce a plasma from a process gas in a plasma chamber to generate one or more species of negative ions. The system includes a grid structure configured to accelerate the one or more negative ions towards the workpiece. The grid structure can include a first grid plate, a second grid plate, and one or more magnetic elements positioned between the first grid plate and second grid plate to reduce electrons accelerated through the first grid plate. The system can include a neutralizer cell disposed downstream of the grid structure configured to detach extra electrons from ions of the one or more species of negative ions to generate energetic neutral species for processing the workpiece.

17 Claims, 7 Drawing Sheets

(56) References Cited

U.S. PATENT DOCUMENTS

| | | | | |
|---|---|---|---|---|
| 6,949,735 | B1* | 9/2005 | Hatakeyama | H01J 27/16 250/251 |
| 7,282,702 | B2 | 10/2007 | Jeon et al. | |
| 9,653,253 | B2 | 5/2017 | DiVergilio et al. | |
| 10,141,161 | B2 | 11/2018 | Gilchrist et al. | |
| 10,887,976 | B2 | 1/2021 | Belchenko et al. | |
| 2003/0098126 | A1 | 5/2003 | Yeom et al. | |
| 2004/0084151 | A1* | 5/2004 | Kim | H01J 37/32009 156/345.46 |
| 2005/0194361 | A1* | 9/2005 | Yeom | H01J 37/321 219/121.36 |
| 2007/0069118 | A1 | 3/2007 | Economou et al. | |
| 2009/0140132 | A1 | 6/2009 | Lee et al. | |
| 2010/0289409 | A1* | 11/2010 | Rosenthal | H01J 37/08 315/111.81 |
| 2014/0272179 | A1 | 9/2014 | Radovanov et al. | |
| 2015/0255242 | A1* | 9/2015 | Divergilio | H01J 37/08 |
| 2015/0287567 | A1 | 10/2015 | Tsujiyama et al. | |
| 2017/0135194 | A1* | 5/2017 | Belchenko | H05H 3/02 |

OTHER PUBLICATIONS

Ion Beam Technology, Nordiko Technical Service, no date.*
PCT International Search Report, and Written Opinion for corresponding PCT Application No. PCT/US2019/045077, dated Nov. 29, 2019, 9 pages.
Bacal, "Physics aspects of negative ion sources," IAEA, Nuclear Fusion, vol. 46, No. 6, May 22, 2006, pp. S250-S259.
Giapis et al., "Hyperthermal neutral beam etching," American Vacuum Society, J. Vac. Sci. Technol. A 13(3), May/Jun. 1995, pp. 959-965.
Cooper, "Summary of the Status of Negative-Ion Based Neutral Beams." Lawrence Berkeley Laboratory University of California, Accelerator & Fusion Research Division, Jan. 1983—14 pages.
Panda et al. "Anisotropic etching of polymer films bv high energy (~100s of eV) oxygen atom neutral beams," American Vacuum Society, J. Vac. Sci. Technol. A 19(2). Mar./Apr. 2001, pp. 398-404.
PCT International Report on Patentability for corresponding PCT Application No. PCT/US2019/045077, dated Feb. 9, 2021, 5 pages.

* cited by examiner

SYSTEMS AND METHODS FOR WORKPIECE PROCESSING USING NEUTRAL ATOM BEAMS

FIELD

The present disclosure relates generally to plasma processing systems and methods.

BACKGROUND

Plasma processing is widely used in the semiconductor industry for deposition, etching, resist removal, and related processing of workpiece(s) (e.g., semiconductor wafers) and other substrates. Plasma sources (e.g., microwave, ECR, inductive, etc.) can be used for plasma processing to produce high density plasma and reactive species for processing workpiece(s).

One type of process using plasma is atomic layer etching. Atomic layer etching is a technique to perform critical etching with very fine precision for semiconductor device manufacturing. Atomic layer etching can be performed on a thin layer while attempting to avoid undue sub-surface damage or undesirable modifications. Atomic layer etching may be performed to etch a very thin layer that overlays another critical layer. Atomic layer etching may also be employed at the end of an etch process for removing minor amounts of a remaining layer that was previously etched without damaging the underlying structures. During etching process, a primary goal can be to etch deep features (e.g., contact hole, deep via, deep trench, or other highly three dimensional features, etc.) anisotropically, and without reactive ion etching (RIE) lag that is an effect typically caused by charge-up at the bottom of a feature being etched.

SUMMARY

Aspects and advantages of embodiments of the present disclosure will be set forth in part in the following description, or may be learned from the description, or may be learned through practice of the embodiments.

One example aspect of the present disclosure is directed to a plasma processing system. The system includes a processing chamber having a workpiece support. The workpiece is configured to support a workpiece. The system includes a plasma source configured to induce a plasma from a process gas in a plasma chamber to generate one or more species of negative ions. The system includes a grid structure configured to accelerate the one or more negative ions towards the workpiece. The grid structure can include a first grid plate, a second grid plate, and one or more magnetic elements positioned between the first grid plate and second grid plate to reduce electrons accelerated through the first grid plate. The system can include a neutralizer cell disposed downstream of the grid structure configured to detach extra electrons from ions of the one or more species of negative ions to generate one or more energetic neutral species for processing the workpiece.

Other example aspects of the present disclosure are directed to systems, methods, and devices for processing a workpiece, such as a semiconductor substrate, such as a semiconductor wafer.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
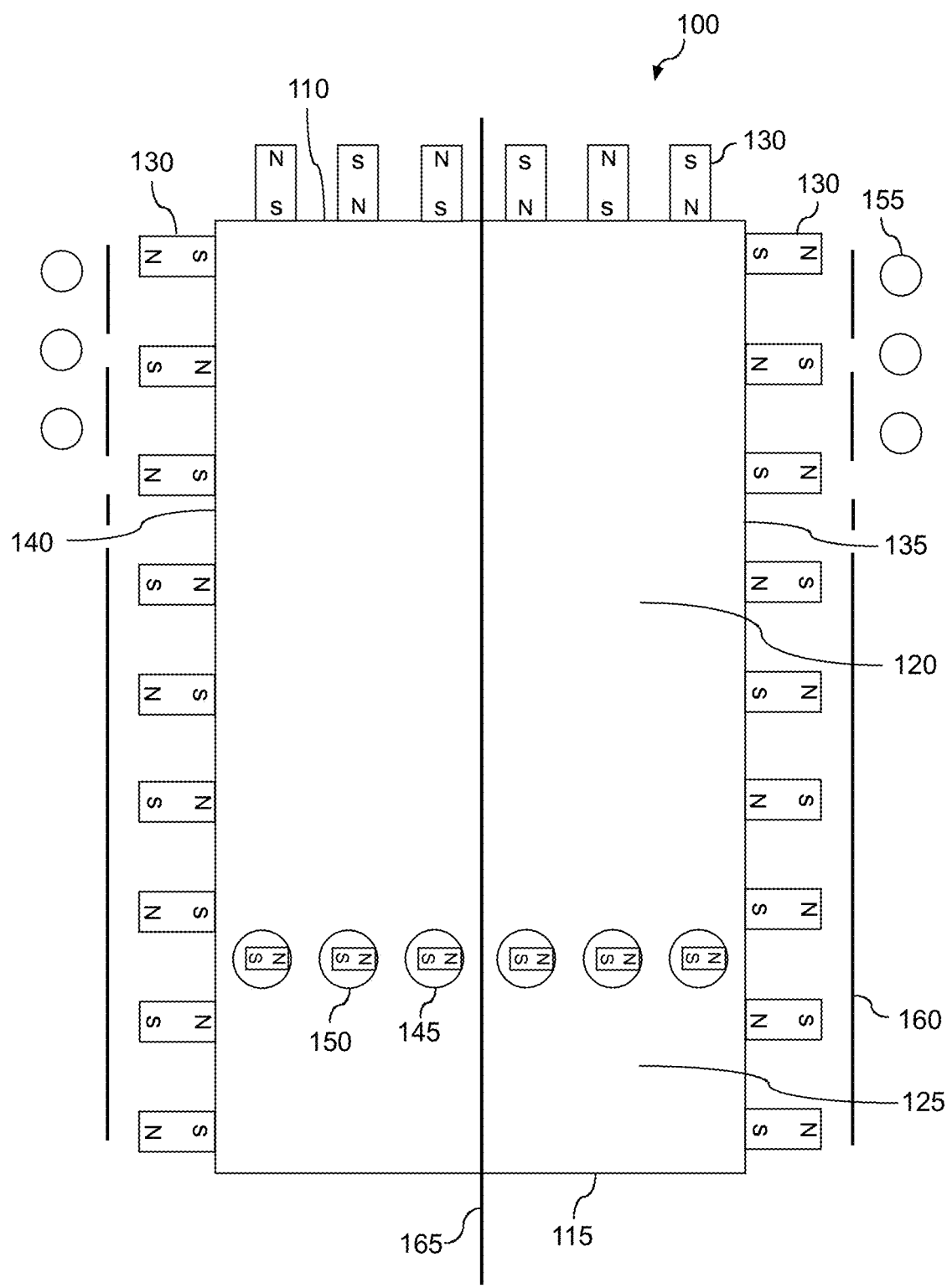
FIG. 1 depicts an example plasma chamber in a plasma processing system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to plasma processing systems and methods for surface treatment and etching, including atomic layer etching and etching deep features anisotropically on workpieces, such as semiconductor workpieces, opto-electronic workpieces, flat panel displays, or other suitable workpieces. In some embodiments, the systems and methods can provide for etching of deep features without reactive ion etching (RIE) lag. The workpiece materials can include, for instance, silicon, silicon germanium, glass, plastic, or other suitable material. In some embodiments, the workpieces can be semiconductor wafers.

Etching systems can use energetic ion bombardment for patterning deep anisotropic features. Some etching systems can increase ion energies to provide anisotropy, relying on wafer conductivity to avoid charge-up. Other such systems can use pulsed plasmas (e.g., pulsed plasma with a frequency greater than about 1 kilohertz (kHz)) so that there can be low energy electron neutralization of positively charged bottoms of deep features that avoids deflection of ions. Some pulsed plasma etching systems can use negative ions alternating with positive ions since electrons quickly attach to, for instance, halogen atoms to form negative ions when a source power is turned off.

There are a few types of neutral atom beam etching systems that use negative ions accelerated to appropriate energies for etching. These neutral atom beam etching systems can remove an extra electron of each negative ion to form energetic neutral atoms either by collisions with gas molecules, or by collision with sides of elongated extraction holes. In both approaches the resulting neutral atoms have increased divergence angles due to angular scattering in the negative ion collisions.

In etching systems, high bias RIE systems often cause ion damage that can cause electrical damage to sensitive structures on a workpiece(s), and can cause faceting at edges of features of the workpiece(s). Etch reactors using alternating positive and negative ion bombardment can suffer from the fact that divergences and current densities of the positive ion and negative ion fluxes to the workpiece(s) are different so that there continues to be net charging of high aspect ratio features on the workpiece(s). Some neutral atom beam etching systems can have substantial beam divergences since ions that impact surface of an aperture at small incidence angles and neutrals come off an extraction aperture surface at a significant range of angles. This divergence problem can limit control of etching rate and sidewall profiles for deep features.

According to example aspects of the present disclosure, plasma processing systems and methods for etching can overcome the above divergence problem.

For instance, example embodiments of the present disclosure can include an ion source with high extraction ion current densities for H−, Cl−, or F− ions with an acceleration grid structure that suppresses electron acceleration during negative ion extraction. Some example embodiments of the present disclosure can provide for highly efficient electron stripping (also referred to as neutralization) from negative ions after acceleration, avoiding, reducing, or minimizing momentum transfer collisions and thereby maintaining very low beam divergence of energetic neutrals. This can provide for etching processes with excellent control, for instance for very deep features to be etched anisotropically with nearly straight sidewalls at a nearly constant and controllable rate, avoiding or reducing "RIE lag". In some embodiments, example embodiments of the present disclosure can provide surface treatment of three dimensional structures on a workpiece surface with neutrals incident at a range of angles such that all surfaces of the workpiece can be adequately exposed and prepared.

Example aspects of the present disclosure have a number of technical effects and benefits. In some embodiments, example embodiments of the present disclosure can be applied for patterning of devices in, for instance, less than about 3 nanometers (nm) to about 7 nm technologies, performing anisotropic etching with acceptable sidewall profile control, reduced sputtering and mask erosion. Applications of example embodiments of the present disclosure can include, but are not limited to, etching of deep vertical features (e.g., both holes and trenches), maintaining vertical sidewalls and a constant etching rate to achieve a desired depth in short process times. Some example embodiments of the present disclosure can provide for surface treatment of a workpiece having three-dimensional surface structures such as Tri-Gates or other structures with superior process characteristics. In some embodiments, example embodiments of the present disclosure can provide advanced reactive ion etching systems for advanced microfabrication processes of both logic devices and memory devices.

According to example aspects of the present disclosure, the plasma processing system can include a plasma source configured to induce a plasma from a process gas in a plasma chamber to generate one or more species of negative ions. In some embodiments, the plasma chamber can be bounded on a first side by a first vacuum wall and on a second side (e.g., second opposing side) by an ion extraction structure that is not a vacuum wall. The plasma chamber can be an evacuated chamber that contains at least two contiguous volumes, such as a first volume and a second volume. Within each volume a plasma can be sustained. The combined plasma volumes may be contained within this plasma chamber.

In some embodiments, the first volume of the plasma chamber can be adjacent and bounded on the first side by the first vacuum wall and on the second side by the second volume. Electromagnetic energy can be transmitted by at least one antenna into the plasma predominantly in the first volume. Gas can be provided to an interior of the plasma chamber. Electrical power provided by a radio frequency (RF) generator to an antenna (e.g., plasma source) adjacent or within the first volume can cause ionization to take place and plasma to be sustained in this first volume. The first volume can be separated from the second side of the plasma chamber by the second volume containing a second plasma within which a reduced rate of ionization (e.g., less than about 10%, such as less than about 1% of the rate in the first volume) takes place. In some embodiments, the second side of the plasma chamber can include an electrically conducting wall that is not a vacuum wall, having a plurality of apertures for ion extraction.

In some embodiments, a first set of permanent magnets can be mounted outside the plasma chamber. In some embodiments, the first set of permanent magnets can be adjacent at least one of outer walls of the plasma chamber within which is the first volume.

In some embodiments, the second volume containing a plasma can be adjacent the first volume. The density of negative ions can be substantially higher in the second volume, while positive ion formation can predominately take place in the first volume. This second volume containing a plasma can be located adjacent the second side of the plasma chamber. Negative ions can be denser in this second volume due to collisions of lower energy electrons with gas molecules that can be in vibrationally excited states and a lower density of high energy electrons than the first volume. Such molecules may have been put into vibrationally excited states by energetic electron collisions in the first volume.

In some embodiments, a second set of magnets (also referred to as a magnetic filter) can be interposed between the first volume and the second volume, thereby separating the ionization plasma from the higher negative ion density plasma. In some embodiments, the magnetic filter can include multiple magnets enclosed in each of a plurality of metal tubes. Within each tube magnets can be aligned with N/S poles generally perpendicular (e.g., within about 15 degrees or less of perpendicular) to a direction along the length of the tube. In some embodiments, the magnets can be smaller than those in the first set to fit within tubes having diameter less than about 2 cm, such as less than about 1.5 cm. The tubes holding magnets can be aligned parallel (e.g., about 5 degrees or less of parallel) to one another traversing the plasma chamber in a direction perpendicular (e.g., about 5 degrees or less of perpendicular) to a direction from the first side to the second side. Adjacent tubes containing magnets can be separated by gaps that can be between about 2 centimeters (cm) and about 10 cm, such as between about 4 cm and 7 cm. Thus, the second volume containing the plasma can be located between the array of tubes containing permanent magnets and the second side. This second set of permanent magnets can function as a barrier to energetic electrons that are generated by the plasma source in the first volume. This magnetic barrier can substantially confine the energetic electrons within the first volume.

This magnetic barrier can protect the negative ions within their formation region in the second volume from energetic electrons that come from the ionization region within the first volume and destroy negative ions by collisional detachment. Providing the array of tubes with magnets can cause an average electron energy or electron temperature in the negative ion formation region of the second volume to be much lower than the average electron energy or electron temperature in the ionization region of the first volume. This average energy should be less than about 2 eV, such as about 1 eV, even when the average electron energy in the first region is between about 3 eV and about 10 eV.

In some embodiments, the process gas can be injected into the plasma in the first volume, or into the plasma in the second volume, or both. Such process gas can include hydrogen, chlorine or fluorine or compounds thereof such as hydrogen fluoride (HF), nitrogen trifluoride ($NF_3$), hydrogen chloride (HCl), chlorine trifluoride ($ClF_3$), and others. In some embodiments inert gases are not fed to any part of the vacuum chamber because their excited states can de-excite and destroy some negative ions.

In some embodiments, the plasma source may be an electrostatically shielded, inductively coupled plasma source (ESICP). In this plasma source, at least one wall of the plasma chamber adjacent the first volume can be made of dielectric material. An induction antenna can be positioned proximate at least one dielectric wall adjacent the first volume.

In some embodiments, the antenna can be connected to a source of RF power to sustain a plasma by ionization in a plasma source volume. An electrically grounded, slotted Faraday shield may be positioned between the antenna and at least one dielectric wall (e.g., in some embodiments, can be the first wall) of the plasma chamber. The first volume of the plasma source can be bounded in the direction toward the second side by the second set of permanent magnets that provides a magnetic barrier for energetic electrons from the first volume.

In some embodiments, the antenna that conveys RF power for ionization into the plasma, can consist of one or more loops within the volume of the source that can be covered by a dielectric enclosure. In some embodiments, an electrostatic or Faraday shield can be interposed between the antenna and the dielectric enclosure. This shield can be electrically grounded and can consist of plates or layers of metal or other electrically conducting materials such as silicon or carbon, or other suitable material.

According to example aspects of the present disclosure, the plasma processing system can include a grid structure as part or all of the second side of the plasma chamber adjacent the second volume but not the first volume and configured to accelerate the one or more negative ions towards the workpiece. The grid structure can include a first grid plate, a second grid plate, and one or more magnetic elements positioned adjacent the first grid plate to reduce electrons accelerated through the first grid plate.

In some embodiments, ions generated in the second volume can diffuse or flow to the grid structure that is positioned at the second side of the plasma chamber for the purpose of accelerating the negative ions. The grid structure can include a plurality of grid plates connected to DC power supplies and configured to cause acceleration of the negative ions from the second volume.

In some embodiments, the first grid plate (or conducting wall) can form a plasma boundary at the second side of the plasma chamber. The first grid plate or the conducting wall is not a vacuum wall, but can have a plurality of apertures that are round holes or elongated holes or long slots (length greater than at least twice the width) through which ions that have been extracted from the plasma in the second volume are then accelerated.

In some embodiments, the first grid plate can be electrically connected to a conducting part (e.g., metal) of the plasma chamber and can be maintained at the same electrical potential as the conducting part of the plasma chamber. In some embodiments, the electrical potential can be different from a ground reference potential. In some embodiments the potential on the plasma chamber can be negative with respect to earth ground having a potential between about −1 kiloVolt and about −20 Volts.

In some embodiments, the second grid plate can include an acceleration structure. The second grid plate can be approximately the same size as the first grid plate. The second grid plate can be positioned proximate the first grid plate and can be spaced from the first grid plate in a direction away from the second volume at a distance that is less than a thickness of the second grid plate (e.g., less than about 2 centimeters).

In some embodiments, the second grid plate can be coupled to a positive potential with respect to the first grid plate. The first grid plate may be negative or positive with respect to ground. In some embodiments, the second grid may be slightly positive with respect to ground to prevent positive ions from the downstream plasma from being accelerated back into the source. The positive potential on the second grid plate can set up an electrical field between the first and second grid plates that extracts and accelerates negative ions. In some embodiments, a direct current power supply can be connected first grid plate or conducting part of the plasma chamber. A separate direct current power supply can be connected to the second grid plate. The direct current power supply can maintain a voltage on the second grid plate that is positive relative to the first grid plate and is negative relative to the ground reference potential.

In some embodiments, the second grid plate can include a plurality of apertures that are aligned with the first plurality of apertures of the first grid plate in such that the one or more negative ions passing through the first plurality of apertures of the first grid plate pass through corresponding apertures of the second plurality of apertures. The plurality of apertures can be extraction slots, or extraction holes. In some embodiments, the plurality of apertures of the second grid plate can have the same shape as the plurality of apertures of the first grid plate. In some embodiments, the plurality of apertures of the second grid plate can be aligned with corresponding apertures of the first grid plate in a direction perpendicular (e.g., about 15 degrees or less of perpendicular) to the first grid plate.

In some embodiments, the one or more magnetic elements can be permanent magnets positioned adjacent the first grid plate (or the second grid plate) to prevent electrons from the plasma within the second volume from being accelerated through the apertures in the first grid plate.

In some embodiments, the magnetic elements can be elongated in shape along a direction that is perpendicular (e.g., within about 5 degrees or less of perpendicular) to their direction of magnetization and mounted such that a length dimension is perpendicular (e.g., about 5 degrees or less of perpendicular) to a direction of ion extraction and/or ion acceleration.

In some embodiments, a length of the one or more magnetic elements is greater than a length of one of the plurality of apertures of the first grid plate. For examples, a length of a magnetic element along its long direction can be greater than a length of an aperture (e.g., a slot, a hole) or greater than a spacing, center-to-center, of adjacent apertures in the first grid plate and/or the second grid plate. Magnetic elements may be shorter if they positioned end-to-end so that their magnetic fields are aligned.

In some embodiments, magnetic field strength at one or more pole faces of the one or more magnetic elements is of the order of about 1 kilo-Gauss or less. The magnetic elements can include ferro-magnetic material having moderate magnetic permeability ($\mu$), not greater than about 10,000 times the permeability of free space ($\mu_0$). In some embodiments, material of the magnetic elements can include ferrites, ceramic magnets, iron-based materials, or some combination thereof.

In some embodiments, the magnets can be aligned, as mounted on or near the first grid plate or the second grid plate or between the two plates such that a direction of the magnetic field of a magnet at the center symmetry plane of the magnet can be perpendicular (e.g., about 5 degrees or less of perpendicular) to a direction of ion extraction at the center of an aperture, and parallel (e.g., about 5 degrees or less of parallel) to the plane of the first or second grid plate. Thus, the magnetic field can cause electrons extracted from the negative ion forming plasma to be substantially retarded in orbital motions and not accelerate with the negative ions through the grid structure.

In some embodiments, the magnets can be mounted such that a magnetic field exceeding about 100 Gauss does not extend more than about 20 mm into the volume of the negative ion forming plasma. The magnets can be protected from ion impingement, behind areas of a grid that have no holes. In some embodiments, the magnets can be mounted on a grid or on other cooled structures such that the magnets do not heat up as the plasma heat flows to the first grid plate or as the ions/neutrals heat the second grid plate. The magnets can be thereby protected from reaching a temperature at which their magnetization is affected.

In some embodiments, the plasma processing system can further include a third grid plate that can be positioned beyond the second grid plate in a direction away from the first and second volumes. In some embodiments, the third grid plate can be maintained by a DC power supply at or very near ground potential. In some embodiments, the third grid plate can include apertures (e.g., holes or slots) that are approximately the same shape and in the same positions as those in the second grid plate such that ions coming through the second grid plate can pass through the apertures in the third grid plate and succeeding grid plates if used. A purpose of the third grid plate and succeeding grid plates can be to suppress particles being accelerated from the volume beyond the last of the grids through apertures in the last grid back through apertures in the preceding grid(s) and possibly first grid plate into the plasma regions. In some embodiments the third grid is maintained at a potential that is slightly negative with respect to ground. This helps reduce the backward acceleration of electrons from the neutralizer region. In some embodiments the permanent magnets may be positioned between the second grid and the third grid and aligned so that the magnetic field of these permanent magnets at the apertures in the first and second grid plates is approximately parallel (within 10 degrees) to the surface in-the-large of the first grid plate and second grid plate. This serves to suppress extraction and acceleration of electrons from the second volume through the grid apertures. In some embodiments the second grid is slightly positive in potential with respect to the third grid so that ions in the neutralizer volume are also not accelerated in reverse direction into the plasma source. In such manner, whether by magnetic field or setting of grid plate potentials or both, back acceleration of particles from the neutralizer region may be reduced. In some embodiments, the magnets described above can also have the effect of suppression of electron acceleration "backward" from the downstream region such as the neutralizer cell into the grid structure or plasma source.

According to example aspects of the present disclosure, the plasma processing system can include a neutralizer cell disposed downstream of the grid structure configured to neutralize the one or more types of negative ions to generate one or more types of neutral species for processing the workpiece. In some embodiments, the plasma chamber can be rotatable relative to the neutralizer cell such that the direction of ions emerging from the third grid may be within about one degree of being parallel to a perpendicular upon the workpiece being processed. Further, in some embodiments such rotation capability may be used to enable the one or more neutral species to process the workpiece at one or more incidence angles relative to a perpendicular constructed upon the workpiece being processed.

In some embodiments, the neutralizer cell can have a depth (e.g. dimension along the direction of travel of the beam through the neutralizer cell) in the range of about 10 centimeters to about 100 centimeters, and in some embodiments between about 20 centimeters to about 50 centimeters. After the negative ions emerge from the grid structure, the ions pass through the neutralizer cell. The neutralizer cell in some embodiments includes intense electromagnetic radiation from a radiation source that can cause the extra electron on a negative ion to be detached from that ion. In some embodiments, the radiation source may include one or more lasers along with mirrors that have very high reflectivity (e.g. greater than about 95%) in the bands of the spectrum of the radiation source. For example, the radiation source can be lasers of a wavelength appropriate to photo-detach an electron from a particular type of negative ion that has been accelerated in the grid structure and is passing through this region. Such radiation can provide efficient neutralization since the radiation passes repeatedly through the volume of the neutralizer cell, being reflected many times from mirrors bounding the neutralization region and effectively is trapped within the neutralizer cell. This gives each photon a many times greater probability of being used to detach an electron.

In some embodiments the neutralizer cell may contain plasma wherein the gas pressure is less than or about 3 Pascals (~23 milliTorr) and in some embodiments less than about 1 Pascal (7.6 milliTorr). Said plasma in some embodiments may have an electron temperature greater than about 3 eV and a density greater than $10^{11}$ electrons/cm$^3$.

In some embodiments, the neutralizer cell can be positioned proximate the third or last grid plate and such that negative ions exiting the grid structure pass through the interior volume within the neutralizer cell. The neutralizer cell can include mirrors positioned on the sides of the neutralizer cell separated from the negative ion beamlets emerging from the apertures in the final grid plate such that neither ions nor fast neutral atoms from any of the apertures strike the mirrors. Thus, the negative ions coming from the final grid plate pass through a region traversed by intense radiation having a concentration of their energy in a desired wavelength band. Such band may include any wavelength such that the energy of the photon is sufficient to detach the excess electron of one of the species of negative ions in the beam. The mirrors can be positioned with highly reflective surfaces facing the negative ions and are of such materials that they reflect the desired wavelengths of radiation with high efficiency, such as greater than about 99%. In the case of a pure photo-detaching neutralizer there may be a relatively low density of plasma in the neutralizer cell—typically there should be sufficient density of positive ions in this plasma that the space-charge of the negative ion beam should be fully compensated by the positive ions in the plasma. Such positive ion density may in some embodiments be of the order of magnitude $10^7$ ions/cm$^3$ or greater, especially when negative ions such as Cl− or F− are among the negative ions issuing from the apertures in the third grid. Such neutralizer plasmas may have a lower density of electrons than of positive ions since the negative ions in the beam provide some of the negative charge in that volume to compensate the charge of the positive ions in the plasma.

In some embodiments, the neutralizer cell can operate to have a high intensity of radiation in the desired wavelength band such that photons with sufficient energy to detach electrons strike nearly all negative ions as the negative ions traverse the neutralizer cell. Wavelengths of light that are less than about 1,000 nanometers can be sufficiently energetic to detach electrons from H− ions, and wavelengths less than about 250 nm can be sufficient to detach electrons from F− and Cl− ions. As such, surplus electrons can be detached from a large majority of negative ions, such that a substantial fraction of the negative ions that entered the neutralizer cell can emerge as neutral atoms having almost the same kinetic energy as the negative ions that entered the neutralizer cells, and, once the surplus electrons are detached from a negative ion the neutral atoms cannot be deflected or scattered. Further, there is minimal scattering of the negative ions in the detachment process since the mass of the electron is so much less than of the ion. In this way, a beam of fast neutral atoms (e.g., H, F or Cl) from photo-neutralization can be effectively mono-energetic and nearly uni-directional with very few of the included neutrals having directions of motion deviating from an average direction of the beam. A highly directional and uniform flux of nearly mono-energetic neutral atoms can be provided to irradiate a workpiece and to perform a process on the workpiece surface. In some embodiments, the beam can be used to etch a workpiece such that exposed areas of the workpiece surface can have at least one atomic monolayer of material removed from the workpiece surface.

In some embodiments, the radiation source can be a solid-state laser that is efficient at producing electromagnetic (EM) radiation in both of above wavelength ranges. Such lasers can efficiently produce adequate intensity to provide a high probability of electron detachment from negative ions with energies below 1 keV for all the above types of ions since the ions spend adequate time in the neutralizer region for the photons to fully neutralize the population of ions in the beam.

According to example aspects of the present disclosure, the plasma processing system can include a processing chamber having a workpiece support. The workpiece support can be configured to support a workpiece. In some embodiments, the workpiece support can provide a physical support for the workpiece to maintain its location and allow for some variations of surface orientation relative to the impinging beam of energetic neutral atoms after the energetic neutral atoms emerge from the neutralizer cell. In some embodiments, the processing chamber can include a gimbal or bearing that can tilt and rotate the workpiece support such that desired angles of beam incidence can be achieved across the entire workpiece.

In some embodiments, the processing chamber can be larger than about 300 millimeters (mm), such as larger than about 350 mm, and the workpiece support can be at least about 300 mm in diameter. In some embodiments, the processing chamber can have a port connected by a duct to a vacuum pump to maintain a suitably low gas pressure in the processing chamber. In some embodiments, the workpiece can be made of crystalline silicon with about 300 mm diameter. However, in some embodiments, other diameters are contemplated (e.g., 200 mm, 450 mm, etc.). Sources of gas can include gas coming from the plasma source through the grid structure and then transiting the neutralizer region and gaseous species coming from the workpiece surface, as well as other gas sources for the neutralizer or gas injected into the workpiece processing volume—potentially for purging or diluting of gases evolved from the workpiece.

In some embodiments, an inert or other processing gas is supplied into the processing chamber. In some embodiments, such inert gas can include helium or argon. In some embodiments, the gas can be a carrier gas, such as nitrogen. Some of this gas, whether nitrogen, helium or argon gas will diffuse back into the plasma chambers and molecular gases can affect a gas phase chemistry in the first volume or the second volume. In some embodiments the gas provided to the workpiece processing or neutralizer chamber can be hydrogen gas or a fluorine or chlorine containing gas such as hydrogen fluoride (HF), nitrogen trifluoride ($NF_3$), hydrogen chloride (HCl), fluorine ($F_2$), chlorine ($Cl_2$), or other suitable gas. Such gas can assist in providing neutral etchant species at the workpiece surface, as well as providing the feedstock for negative ion formation in the plasma source chamber. In some embodiments, the pressure in the processing chamber can be less than the gas pressure in the plasma chamber (e.g., both in the first or the second volumes). In some embodiments, under certain gas feed conditions, the gas pressure in the workpiece processing volume can be greater than the gas pressure in the plasma source chamber. In this case, the gases fed into the plasma and/or neutralizer regions will also provide gaseous species through the acceleration grid structure for ionization in the plasma source. In some embodiments there may be no gas injected directly into the plasma source chamber while there are gases injected into the neutralizer chamber and/or the wafer processing volume.

In some embodiments, the plasma source for providing ions can be a microwave source employing electron cyclotron resonance (ECR) heating of the plasma electrons. This type of plasma source can be highly efficient and can produce both ionization and excitation of molecular gas species. In some embodiments, an orientation of a magnetic field axis in the ECR source can be made perpendicular (e.g., in some embodiments about 5 degrees or less of perpendicular) to a direction from the first wall to the grid structure. In such configuration, the magnetic field that produces a resonance condition for electrons at a microwave frequency of approximately 2.45 GHz can be a magnetic field of about 875 Gauss in the resonance region. This strong magnetic field will confine the energetic electrons and keep these electrons from rapidly diffusing to a volume near the grid structure and thus allowing a negative ion formation region adjacent the grid structure to have a reduced electron temperature resulting in a high density of negative ions. In some embodiments, this magnetic field can be used for a resonant production of the plasma in the ionization volume to partition the plasma chamber into ionization volume and negative ion formation region without needing magnetic confinement rods.

In some embodiments, the ECR source may use two large solenoids that are positioned on either side of a cylindrical plasma chamber at a distance from one another. This configuration is also called the Helmholtz configuration that creates a solenoidal magnetic field with a symmetry axis perpendicular (e.g., about 15 degrees or less of perpendicular) to a symmetry axis of the plasma chamber. The resonance field condition can be at or near a midpoint between the solenoids near the symmetry axis of the magnetic field. In this configuration, the microwaves can be fed along the axis of the plasma chamber from the back through a dielectric window into the plasma chamber. This configuration can include a substantial distance between a region in the plasma where electrons are heated and a place where the negative ion formation takes place.

In some embodiments, the magnetic field on the axis of a set of electromagnets can be in a direction generally perpendicular (e.g., about 5 degrees or less of perpendicular) to a direction of extraction of negative ions at the surface of the extraction grid plate (e.g., the first grid plate), such that the magnetic field can suppress an acceleration of the electrons through the grid plates while allowing the negative ions to be accelerated virtually without deflection. In some embodiments the magnetic field strength at the apertures may be between about 20 Gauss and about 1000 Gauss, such as between 100 Gauss and 500 Gauss at the extraction apertures in the first grid plate.

Variations and modifications can be made to these example embodiments of the present disclosure. As used in the specification, the singular forms "a," "and," and "the" include plural referents unless the context clearly dictates otherwise. The use of "first," "second," "third," and "fourth" are used as identifiers and are directed to an order of processing. Example aspects may be discussed with reference to a "substrate," "wafer," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value. The use of the term "generally perpendicular" refers to within about 15 degrees of perpendicular. The use of the term "generally parallel" refers to within about 15 degrees of parallel.

Figure 2:
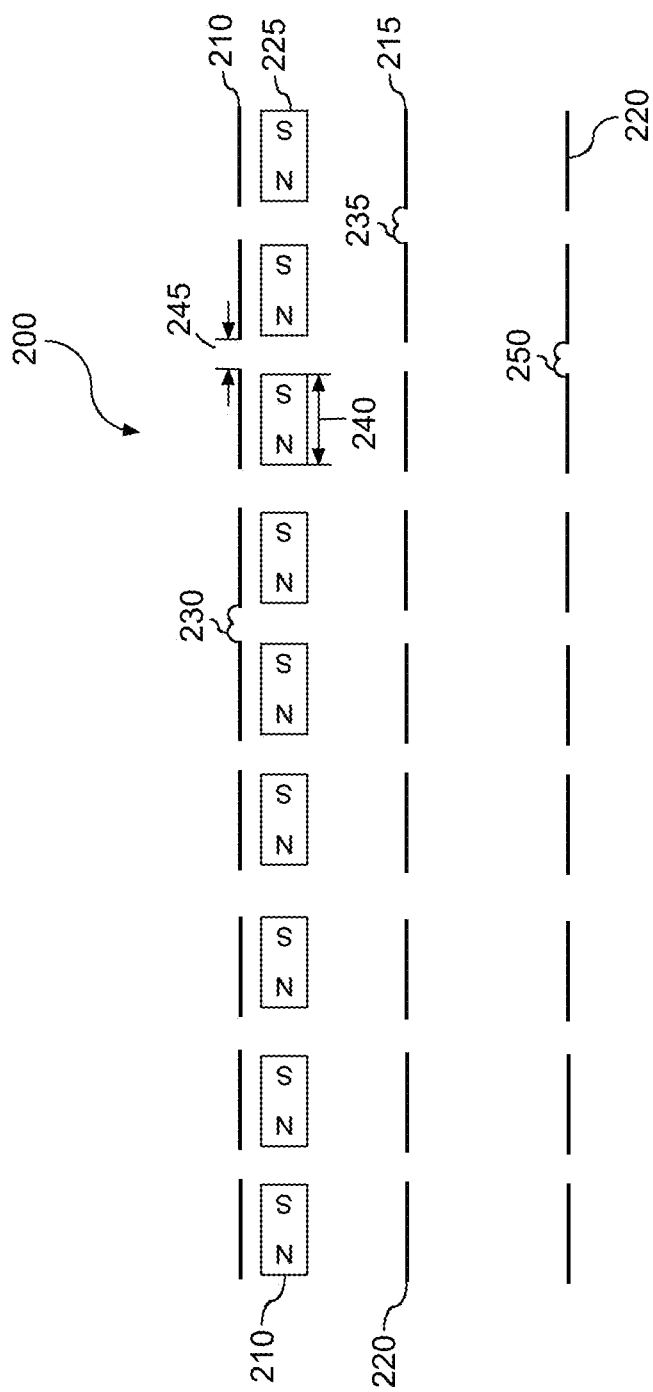
FIG. 2 depicts an example grid structure in a plasma processing system according to example embodiments of the present disclosure.

With reference now to the FIGS., example embodiments of the present disclosure will now be discussed in detail. FIG. 1 depicts an example plasma chamber 100 in a plasma processing system according to example embodiments of the present disclosure. As shown in FIG. 1, the plasma chamber 100 is bounded on a first side 110 by a first vacuum wall and on a second side 115 by a grid structure (as shown in FIG. 2) that is not a vacuum wall. The plasma chamber 100 contains a first volume 120 where ionization predominately takes place and a second volume 125 where negative ion formation predominantly takes place. The first volume 120 of the plasma chamber 100 can be adjacent and bounded on the first side 110 by the first vacuum wall and on the second side 115 by the second volume 125. The first volume 120 includes an ionization plasma (not shown), and the second volume 125 includes a negative ion containing plasma (not shown).

In some embodiments, a first set of magnets 130 can be adjacent at least one of outer walls of the plasma chamber 100 within which is the first volume 120. For instance, the first set of magnets 130 can be adjacent the first side 110, a first sidewall 135 and a second sidewall 140. In some embodiments, the first set of magnets 130 can be permanent magnets. For instance, the first set of magnets 130 can form a set of magnetic rings with substantially similar shape to the plasma chamber 100. In some embodiments, the first set of magnets 130 can be configured in rows with alternating polarity from row to row.

In some embodiments, a second set of magnets (also referred to as a magnetic filter) 145 can be interposed between the first volume 120 and the second volume 125, and thereby separate the ionization plasma from the negative ion plasma, such that the average electron energy, or electron temperature in the ionization region of the first volume 120 is much greater than in the second volume. In some embodiments the electron temperature can be more than twice as great in the first volume as in the second volume. In some embodiments, the second set of magnets 145 can be permanent magnets. In some embodiments, each of the second set of magnets 145 can be housed in a tube 150 (e.g. a metal tube, a water-cooled rod, etc.). In some embodiments, the magnetic filter 145 can include multiple magnets 145 in a linear arrangement enclosed in each of multiple metal tubes 150. In some embodiments, the magnets 145 within each tube 150 can be aligned with N/S poles generally perpendicular (e.g., within about 15 degrees or less of perpendicular) to a direction along the length of the tube 150. In some embodiments, each of the second set of magnets 145 can be smaller than each of the first set of magnets 130 to fit within the tube 150, such as in a tube 150 having a diameter less than about 0.5 inches.

The tubes 150 holding the second set of magnets 145 can be aligned parallel (e.g., about 15 degrees or less of parallel) to one another traversing the plasma chamber 100 in a direction perpendicular (e.g., about 15 degrees or less of perpendicular) to a direction from the first side 110 to the second side 115. Adjacent tubes 150 containing the second set of magnets 145 can be separated by gaps. In some embodiments, the gaps can be between about 2 centimeters (cm) and about 10 cm. Thus, the second volume 125 containing the plasma can be located between the array of tubes 150 containing the second set of magnets 145 and the second side 115.

The second set of magnets 145 may provide a magnetic field that functions as a barrier to energetic electrons that are generated by the plasma source 155 in the first volume 120. This magnetic barrier can protect the second volume 125 from energetic electrons that can come from the first volume 120 that could destroy negative ions by collisional detachment. Providing the array of tubes 150 containing the second set of magnets 145 can cause an average electron energy or electron temperature in the negative ion formation region of the second volume 125 to be much lower than the average electron energy or electron temperature in the ionization region of the first volume 120. In some embodiments the electron temperature in the first volume may be more than twice the electron temperature in the second, dense negative ion-containing volume This magnetic filter and the resulting electron temperature differential greatly reduces the rate at which negative ions are destroyed in the second volume by electron impact so that more such ions may be extracted and accelerated. In some embodiments the average electron energy in the negative ion forming region may be less than about 2 eV such as less than about 1.5 eV. In some embodiments wherein hydrogen ions are to be extracted the average electron energy may advantageously be less than about 1.0 eV in the second volume. The average electron energy in the first volume, the positive ion forming region, may be greater than about 2.5 eV and such as greater than about 3 eV.

In some embodiments the excitation antenna for the plasma source 155 is positioned proximate at least one dielectric wall (e.g., 135 and/or 140) adjacent the first volume 120. A Faraday (electrostatic) shield 160 may be positioned between the excitation antenna 155 and at least one dielectric vacuum wall (e.g., 135 and/or 140). The Faraday shield 160 can be electrically grounded and can consist of plates or layers of metal or other electrically conducting materials such as silicon or carbon, or other suitable materials. In some embodiments the Faraday shield 160 may be positioned symmetrically (e.g., within about 15 degrees or less of parallel) about the source axis of symmetry 165 of the plasma chamber 100. The Faraday shield 160 can be slotted. For instance, the Faraday shield 160 can be slotted parallel to the source axis of symmetry 165.

FIG. 2 depicts an example grid structure 200 in a plasma processing system according to example embodiments of the present disclosure. The grid structure 200 can be configured to accelerate the one or more types of negative ions towards a workpiece. In some embodiments, the grid structure 200 includes a first grid plate 210, a second grid plate 215, a third grid plate 220, and a set of magnetic elements 225 positioned between the first grid plate 210 and second grid plate to reduce electrons accelerated through the first grid plate 210. In some embodiments the magnets may be positioned embedded within the first or second grid plate. In some embodiments the magnets may be positioned between the second and third grids. In some embodiments, ions generated in the second volume 125 can diffuse or flow to the grid structure 200 that is positioned at the second side 115 of the plasma chamber 100 for the purpose of accelerating the negative ions. The grid structure 200 can include a plurality of grid plates 210, 215, 220 configured to cause acceleration of the negative ions from the second volume 125.

The first grid plate 210 forms a plasma boundary at the second side 115 of the plasma chamber 100 as shown in FIG. 1. The first grid plate 210 is not a vacuum wall but has a plurality of apertures 230. The apertures 230 can be round holes, elongated holes, or long slots through which ions that have been extracted from the negative ion forming plasma in the second volume 125 are then accelerated.

In some embodiments, the first grid plate 210 can be electrically connected to a conducting part (e.g., metal) of the plasma chamber 100 and can be maintained at the same electrical potential as a conducting part of the plasma chamber 100. In some embodiments said conducting part of the chamber preferably should be in contact with plasmas in both first and second volumes. For example, the conducting part of the plasma chamber 100 can include the first sidewall 135 and/or the second sidewall 140. The electrical potential can be different from a ground reference potential. The second volume 125 that is adjacent the first grid plate 210 can contain a plasma having a high density of negative ions. The negative ions can be extracted through the apertures 230 in the first grid plate 210 and accelerated by the grid structure 200.

The second grid plate 215 is approximately the same size as the first grid plate 210. The second grid plate 215 is positioned proximate the first grid plate 210 and, in some embodiments, is spaced from the first grid plate 210 in a direction away from the second volume 125 at a distance that is less than a thickness of the second grid plate 215 (e.g., less than about 2 centimeters).

In some embodiments, the second grid plate 215 can include a second plurality of apertures 235 that are aligned with the first plurality of apertures 230 of the first grid plate 210 such that the one or more negative ions passing through the first plurality of apertures 230 of the first grid plate 210 pass through corresponding apertures 235 of the second plurality of apertures 235. The apertures 235 of the second grid plate 215 can be extraction slots, or extraction holes. The apertures 235 of the second grid plate 215 have approximately the same shape as the apertures 230 of the first grid plate 210 and are aligned with corresponding apertures 230 of the first grid plate 210 in a direction generally perpendicular (e.g. within about 15 degrees or less of perpendicular) to the first grid plate 210.

In some embodiments, the second grid plate 215 can be coupled to a positive potential with respect to the first grid plate 210. The positive potential can set up an electrical field between the first grid plate 210 and second grid plate 215. The electrical field can extract the negative ions from the plasma in the second volume 125. In some embodiments, a direct current power supply can be connected to the second grid plate 215. The direct current power supply can maintain a voltage on the second grid plate 215 that is positive relative to the first grid plate 210 and in some embodiments may be negative relative to the ground reference potential.

The set of magnetic elements 225 is positioned between the first grid plate 210 and the second grid plate to prevent electrons from the plasma within the second volume 125 from being accelerated through the apertures 230 in the first grid plate 210. In some embodiments, the set of magnetic elements 225 can be permanent magnets. In some embodiments, the magnetic elements 225 can be elongated in shape along a direction that is perpendicular (e.g., about 15 degrees or less of perpendicular) to their direction of magnetization and mounted such that a length dimension is perpendicular (e.g., about 15 degrees or less of perpendicular) to a direction of ion extraction and/or ion acceleration. A length 240 of a magnetic element is greater than a length 245 of an aperture of the first grid plate 210. For examples, a length 240 of a magnetic element along its long direction can be greater than a length 245 of an aperture (e.g., a slot, a hole) or greater than a spacing, center-to-center, of adjacent apertures in the first grid plate and/or the second grid plate. In some embodiments the magnets may be embedded into the first or the second grid so that the gap between magnets on opposite sides of a slit can be minimized. Further, the magnetic field in the slit will be nearly parallel to the gross scale surface of the grid plate so that suppression of electron acceleration will be most effective.

In some embodiments, magnetic field strength at one or more pole faces of magnetic elements 225 is of the order of about 1 kilo-Gauss or less. The set of magnetic elements 225 can include ferro-magnetic material having moderate magnetic permeability ($\mu$), not greater than about 10,000 times the permeability of free space ($\mu_o$). In some embodiments, material of the set of magnetic elements 225 can include ferrites, ceramic magnets, iron-based materials, or some combination thereof.

In some embodiments, the set of magnetic elements 225 can be aligned, as mounted on, near or between the first grid plate 210 or the second grid plate 215 or embedded within either grid plate such that a direction of the magnetic field at the center of an aperture can be perpendicular (e.g., within about 10 degrees or less of perpendicular) to a direction of ion extraction at the center of an aperture 230, and parallel (e.g., about 15 degrees or less of parallel) to the plane of the first grid plate 210 and/or the second grid plate 215. Thus, the magnetic field can cause electrons extracted from the negative ion forming plasma to be substantially retarded in orbital motions and not accelerated with the negative ions through the grid structure 200 which might cause damage to the substrate.

In some embodiments, the set of magnetic elements 225 can be mounted such that a significant magnetic field (e.g. greater than about 100 Gauss) does not extend more than about 5 centimeters into the volume of the negative ion forming plasma. In some embodiments, a significant magnetic field does not extend more than about 2 centimeters into the volume of the negative ion forming plasma. The set of magnetic elements 225 can be protected from ion impingement, behind areas of a grid that have no holes. In some embodiments, the set of magnetic elements 225 can be mounted on a grid or on other cooled structures such that the magnets do not heat up as the plasma heat flows to the first grid plate 210 or as the ions/neutrals heat the second grid plate 215. The set of magnetic elements 225 can be thereby protected from reaching a temperature at which their magnetization is affected. In some embodiments, the set of magnetic elements 225 can also have the effect of suppression of electron acceleration "backward" from the downstream region such as the neutralizer cell 300 of FIG. 3 into the grid structure 200 or plasma chamber 100 of FIG. 1.

The third grid plate 220 is positioned beyond the second grid plate 215 in a direction away from the first volume 120 and the second volume 125. The third grid plate 220 includes apertures 250 (e.g., holes or slots) that are approximately the same shape and in the same positions as the second plurality of apertures 235 in the second grid plate 215 such that ions coming through the second grid plate 215 pass through the apertures 250 in the third grid plate 220. In some embodiments, the third grid plate 220 can be electrically grounded or maintained by a DC power supply near ground potential. In some embodiments the third grid plate 220, if biased negatively by a modest amount ($|V_{3,B}| \leq$ about 25 V) relative to ground potential, can suppress negatively-charged particles being accelerated from a volume beyond the third grid plate 220 back through apertures 230, 235, 250 into the plasma chamber 100 of FIG. 1. Further, if along with the third grid being biased negatively, the second grid is biased positively by a modest amount ($|V_{2,B}| \leq$ about 25 V) relative to the third grid this can further suppress back-acceleration of positive ions from the region past the third grid back into the second volume from which negative ions are extracted.

Figure 3:
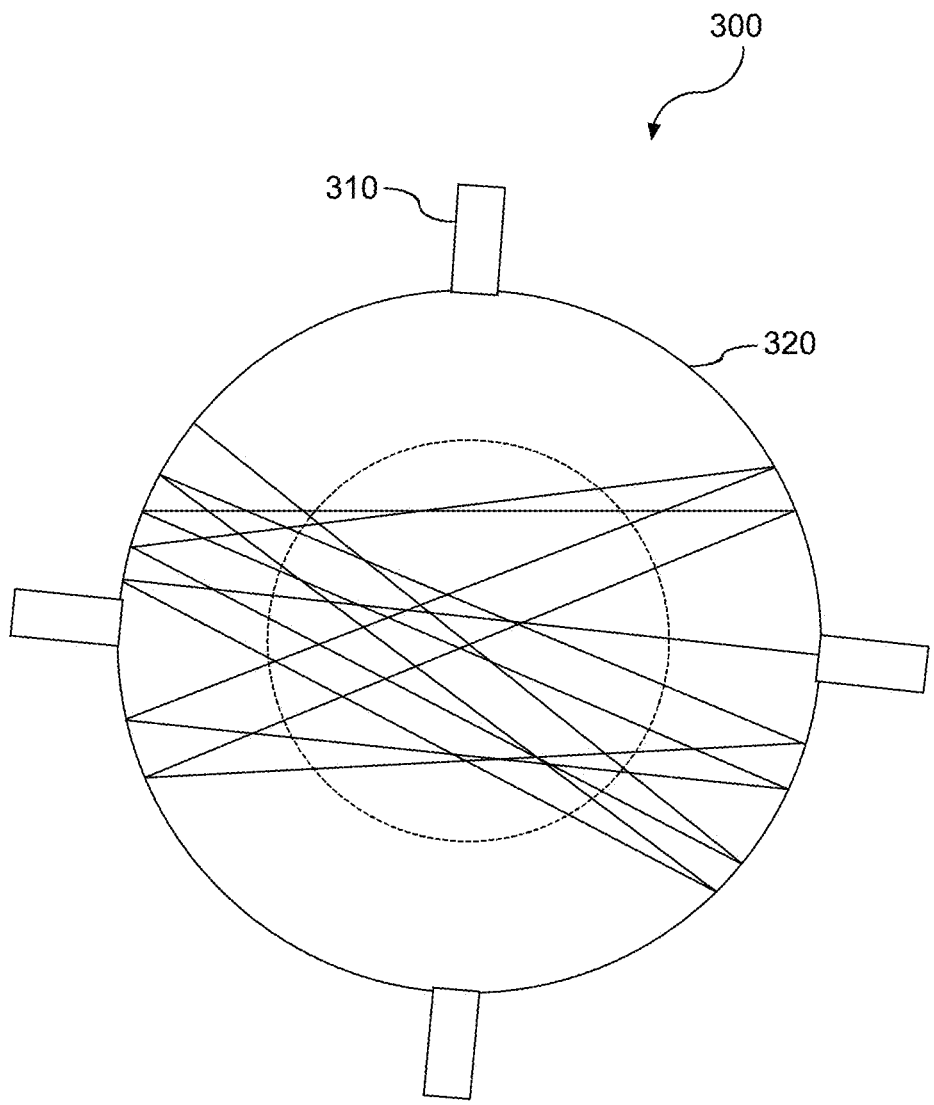
FIG. 3 depicts an example neutralizer cell in a plasma processing system according to example embodiments of the present disclosure.

FIG. 3 depicts an example neutralizer cell 300 in a plasma processing system according to example embodiments of the present disclosure. The neutralizer cell 300 can be configured to detach electrons from one or more types of negative ions to generate one or more types of neutral species for processing a workpiece. The neutralizer cell 300 can be disposed downstream of the grid structure 200 of FIG. 2. In some embodiments, the neutralizer cell 300 can have a depth (e.g. dimension along the direction of travel of a beam through the neutralizer cell 300) in the range of about 10 centimeters to about 100 centimeters, such as about 20 centimeters to about 50 centimeters.

In some embodiments, the plasma chamber 100 including the first, second and third grids can be rotatable about an axis parallel to the third grid surface that is a diameter of the third grid and may be perpendicular to the long direction of the slit apertures. This rotates the source relative to the neutralizer cell 300 such that the one or more neutral species pass through the neutralizer parallel to its axis so that they can impact a workpiece at normal incidence as well as at small off-normal incidence angles (less than or about 15°).

The neutralizer cell may include intense electromagnetic (EM) radiation from one or more radiation sources 310 with wavelength in one or more bands that can detach extra electron from a negative ion. In some embodiments, the one or more radiation sources 310 can include one or more lasers, or one or more plasma discharges having intense EM radiation production, or any efficient high intensity source of such radiation. The EM radiation should illuminate that part of the neutralizer volume through which negative ions pass, and unabsorbed radiation should preferably be reflected back through that volume penetrated by the negative ion beam by mirrors. For example, the one or more radiation sources 310 can be lasers of a wavelength appropriate to photo-detach an electron from a particular type of negative ion that has been accelerated in a grid structure, such as the grid structure 200 of FIG. 2. Such radiation can provide efficient neutralization since due to the circumferential mirrors 320 the radiation may pass repeatedly through the volume of the neutralizer cell 300, being reflected many times and partially trapped within the neutralizer cell 300. The neutralizer cell 300 is positioned proximate the third grid plate 220 and such that negative ions exiting the grid structure 200 pass through the neutralizer cell 300.

The neutralizer cell 300 includes mirrors 320 positioned on the periphery of the neutralizer cell 300 separated from negative ion beamlets emerging from the apertures 250 in the third grid plate 220 such that neither unscattered ions nor fast neutral atoms from any of the apertures 250 strike the mirrors 320. The mirrors 320 are positioned with highly reflective surfaces facing the negative ion beam after it emerges from the third grid and are of such materials that they reflect the desired wavelengths of radiation with high efficiency—(e.g. greater than about 99%). Thus, the negative ions coming from the third grid plate 220 pass through the neutralizer region that is repeatedly traversed by intense radiation.

In some embodiments, the neutralizer cell 300 can operate to have a high intensity of radiation in desired wavelength band(s) such that photons in such band having sufficient energy to detach electrons strike nearly all negative ions as the negative ions traverse the neutralizer cell 300. Said radiation in desired wavelength band(s) wherein photons have sufficiently large (greater than $10^{-18}$ cm$^2$) cross section for detaching extra electrons from those types of negative ions passing through the neutralizer cell. Because of the peripheral mirrors some photons of this radiation may be multiply reflected to pass through the beam volume a sufficient number of times to have a fair probability of detaching electrons from some negative ion. As such, surplus electrons can be detached from a large majority of negative ions, such that a substantial fraction of the negative ions that entered the neutralizer cell 300 can emerge as neutral atoms having almost the same kinetic energy as the negative ions that entered the neutralizer cells 300, and the neutral atoms cannot be deflected or scattered by electrical or magnetic fields. In this way, a beam of fast neutral atoms (e.g., H, F or Cl) can be effectively mono-energetic and nearly uni-directional with very few of the included neutrals having directions of motion deviating by more than a few degrees from an average direction of the beam. A highly directional and uniform flux of nearly mono-energetic neutral atoms can be provided to irradiate a workpiece and to perform a process on the workpiece surface.

Figure 4:
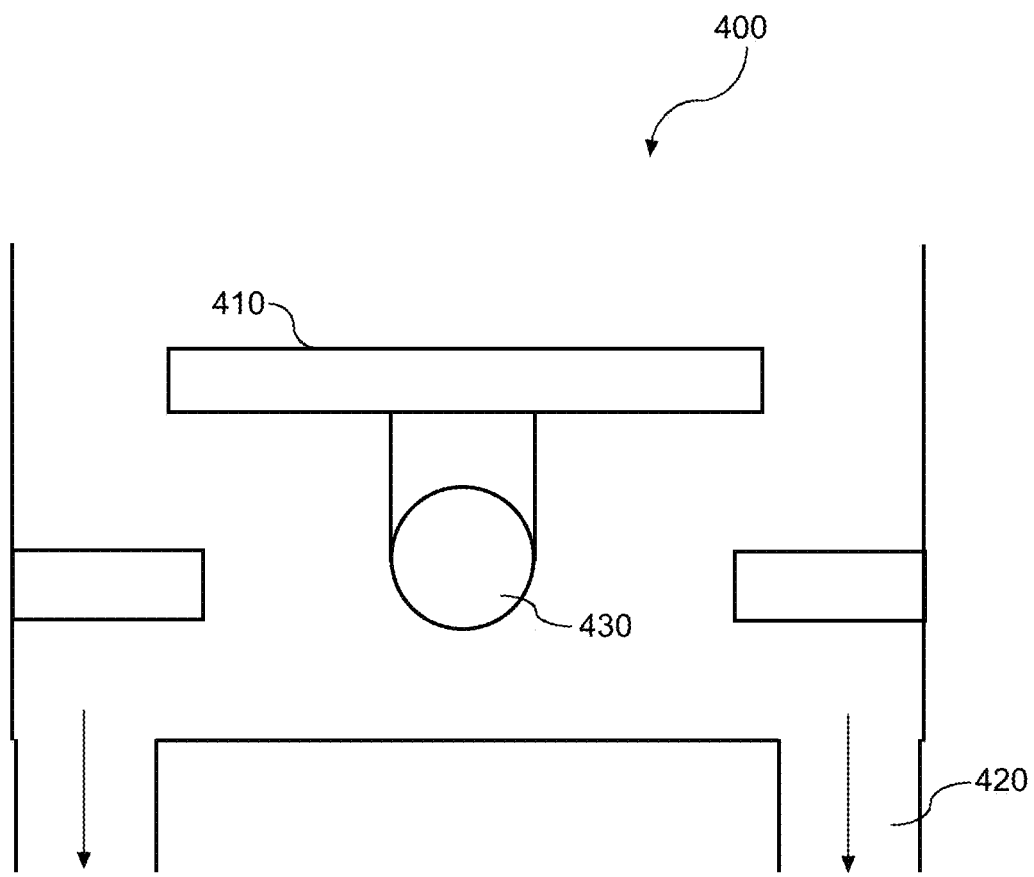
FIG. 4 depicts an example processing chamber in in a plasma processing system according to example embodiments of the present disclosure.

FIG. 4 depicts an example processing chamber 400 in in a plasma processing system according to example embodiments of the present disclosure. The workpiece support 410 provides a physical support for a workpiece (not shown) to maintain its location and allow for some variations of surface orientation relative to the impinging beam of energetic neutral atoms after the energetic neutral atoms emerge from the neutralizer cell 300. For instance, the processing chamber 400 can include a gimbal or bearing 430 that tilts and rotates the workpiece support 410 such that desired angles of beam incidence can be achieved across the entire workpiece. The processing chamber 400 has a port connected by a duct to a vacuum pump 420 to maintain a suitable gas pressure, such as a suitably low gas pressure, in the processing chamber 400. In some embodiments the workpiece support may further permit rotation about an axis perpendicular to the workpiece and at its center—thereby providing an averaging of the beam incidence across the workpiece.

In some embodiments, the processing chamber can be larger than about 300 millimeters (mm) and the workpiece support can be at least about 300 mm in diameter. In some embodiments, the processing chamber can have an internal diameter of at least about 350 mm. In some embodiments, the workpiece can be made of crystalline silicon with about 300 mm in diameter. However, other diameters are contemplated (e.g., 200 mm, 450 mm, etc.).

In some embodiments, an inert or other processing gas may be supplied into the processing chamber 400. For instance, sources of gas can include gas coming from the plasma chamber 100 through the grid structure 200 and then transiting the neutralizer region 300 and/or gaseous species coming from the workpiece surface. In some embodiments, such inert gas can include helium or argon. In some embodiments, the gas can be a carrier gas, such as nitrogen. The helium or argon gas can diffuse back into the plasma chamber 100 and molecular gases can affect a gas phase chemistry in the first volume 120 or the second volume 125. In some embodiments. the gas provided to the processing chamber 400 can be hydrogen gas or a fluorine or chlorine containing gas such as hydrogen fluoride (HF), nitrogen trifluoride ($NF_3$), hydrogen chloride (HCl), fluorine ($F_2$), chlorine ($Cl_2$), or other suitable gas. Such gas can be a source of negative ions and thus assist in providing neutral etchant species at the workpiece surface. In some embodiments, the pressure in the processing chamber 400 can be less than the gas pressure in the plasma chamber 100 (e.g., both in the first volume 120 or the second volume 125). In some embodiments the gas pressure in the plasma chamber may be less than that in the neutralizer region or the substrate processing region.

Figure 5:
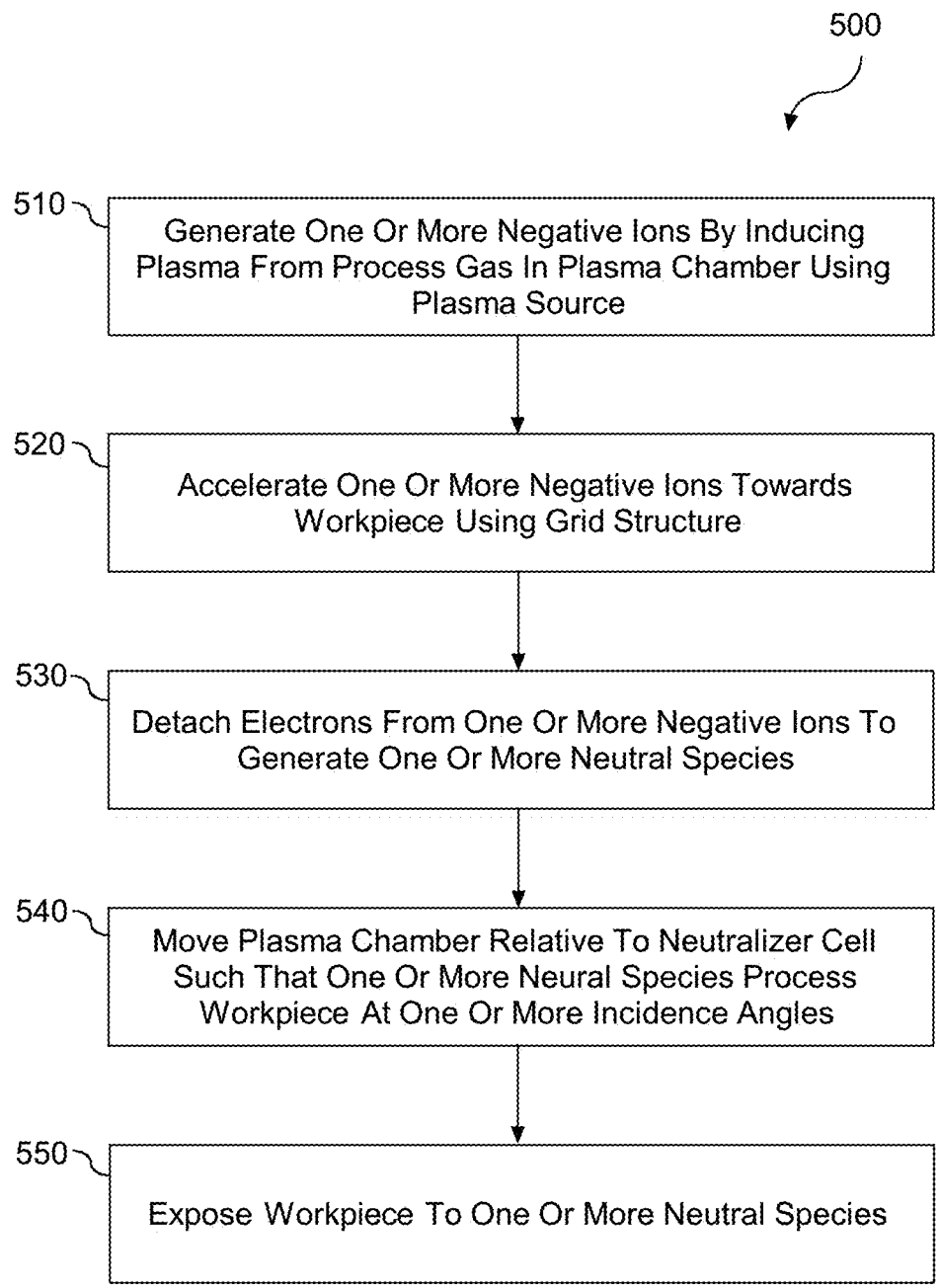
FIG. 5 depicts a flow diagram of a process for processing a workpiece in a plasma processing system according to example embodiments of the present disclosure.

FIG. 5 depicts a flow diagram of a process (500) for processing a workpiece in a plasma processing system according to example embodiments of the present disclosure. The process (500) can be implemented using the plasma processing system. However, as will be discussed in detail below, the process (500) according to example aspects of the present disclosure can be implemented using other plasma-based processing systems without deviating from the scope of the present disclosure. FIG. 5 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (510), the process can include generating one or more types of negative ions by inducing a plasma from a process gas in a plasma chamber using a plasma source. For example, in the example embodiments of FIG. 1, the plasma source 155 induces a plasma in the plasma chamber 100 to generate one or more negative ions. Negative ion formation can predominantly take place in the second volume 125 of plasma chamber 100 of FIG. 1. Negative ions can be formed at a high rate in the second volume 125 due to collisions of lower energy electrons with gas molecules that can be in vibrationally excited states. Such molecules can have been put into vibrationally excited states by energetic electron collisions in the first volume 120.

At (520), the process can include accelerating the one or more types of negative ions towards the workpiece using the grid structure 200 of FIG. 2. Negative ions may be extracted from the second volume at high current densities because the negative ions are not destroyed by impacts of energetic electrons which are substantially confined in the first volume. In some embodiments, ions generated in the second volume 125 can diffuse or flow to the grid structure 200 that is positioned at the second side 115 of the plasma chamber 100 for the purpose of accelerating the negative ions. The grid structure 200 can include a plurality of grid plates 210, 215, 220 configured to cause acceleration of the negative ions from the second volume 125. For example, in the example embodiments of FIG. 2, the grid structure 200 includes the first grid plate 210, the second grid plate 215, and one or more magnetic elements 225 positioned adjacent the first grid plate 210 to reduce electrons accelerated through the first grid plate 210. The grid structure 200 also includes the third grid plate 220 for further accelerating or decelerating one or more types of negative ions exiting the second grid plate. For instance, the third grid plate 220 can have a further function, to suppress charged particles being accelerated backwards from a volume beyond the third grid plate 220 back through apertures 230, 235, 250 into the plasma chamber 100 of FIG. 1, such as the second volume 125 or the first volume 120. As previously stated, if the third grid plate is biased negatively relative to earth ground by less than or about 25 Volts and the second grid plate is biased positively relative to earth ground by at least about 10 Volts there will be very few electrons or positive ions back accelerated by the grids from the plasma in the neutralizer region into the plasma source volume. This can be highly desirable to avoid waste of power and undesirable heating of the first and second grids.

At (530), the process can include detaching the electrons from the one or more species of negative ions to generate one or more neutral species. For example, in the example embodiments of FIG. 3, the neutralizer cell 300 includes multiple radiation sources 310 that cause the extra electron on a negative ion to be detached from that ion to generate one or more neutral species. In some embodiments, the neutralizer cell 300 can operate to have a high intensity of radiation in a desired wavelength band such that photons with sufficient energy to detach electrons strike nearly all negative ions as the negative ions traverse the neutralizer cell 300. As such, a surplus electron can be detached from a large majority of negative ions, such that a substantial fraction of the negative ions that entered the neutralizer cell 300 can emerge as neutral atoms having almost the same kinetic energy as the negative ions that entered the neutralizer cells 300, and the neutral atoms cannot then be deflected or scattered by electric fields in the process region or at the wafer. For instance, in some embodiments the one or more radiation sources 310 can cause an extra electron on a negative ion to be detached from that ion. In some embodiments, the one or more radiation sources 310 can include one or more lasers, one or more plasma discharges, or some combination thereof. For example, the one or more radiation sources 310 can be lasers of a wavelength appropriate to photo-detach an electron from a particular type of negative ion that has been accelerated in a grid structure, such as the grid structure 200 of FIG. 2.

At (540), the process can include rotating the plasma chamber relative to the neutralizer cell such that one or more neutral species process the workpiece at one or more incidence angles. For example, the plasma processing system can rotate the plasma chamber 100 relative the neutralizer cell 300 such that one or more neutral species process the workpiece in the processing chamber 400 at one or more incidence angles. For instance, the plasma chamber can be moved to provide surface treatment of three dimensional structures on a workpiece surface with neutrals incident at a range of angles such that all surfaces of the workpiece can be adequately exposed and prepared. The rotation can also serve to provide a neutral beam that is incident perpendicular to the substrate surface since the magnetic field used to suppress electron acceleration by the grids also causes the negative ions to be slightly bent in their path and not to accelerate perpendicularly to the first or second grid plates.

At (550), the process can include exposing the workpiece to one or more neutral species. For example, in the example embodiments of FIG. 4, the workpiece support 410 provides a physical support for the workpiece to maintain its location and allow for some variations of surface orientation relative to the impinging beam of energetic neutral atoms after the energetic neutral atoms emerge from the neutralizer cell 300. For instance, the beam can be used to etch the workpiece such that exposed areas of the workpiece surface can have at least one atomic monolayer of material removed from the workpiece surface.

Figure 6:
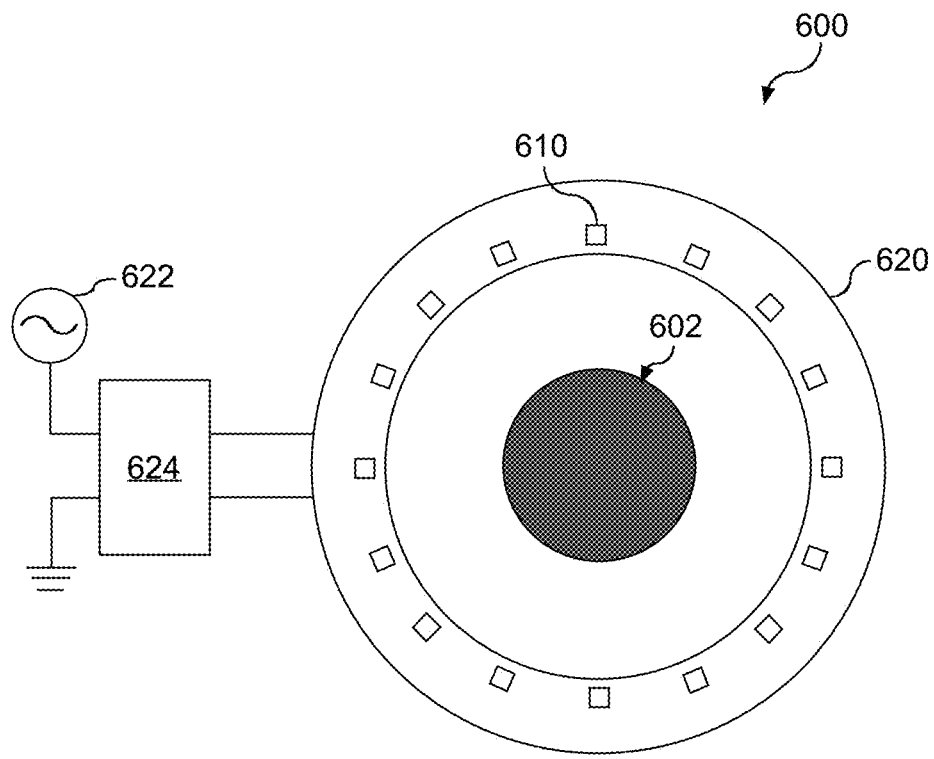
FIG. 6 depicts an example neutralizer cell in a plasma processing system according to example embodiments of the present disclosure.

FIG. 6 depicts an example plasma-based neutralizer cell 600 that can be used in a plasma processing system according to example embodiments of the present disclosure. In some embodiments, the neutralizer cell 600 can be used in place of the neutralizer cell show in FIG. 3. In some embodiments the neutralizer cell 300 can include of a high density plasma that has warm electrons (average electron energy greater than about 3 eV) that collisionally detach extra electrons from a large majority of negative ions in the beam and where the sufficiently energetic photons generated by the plasma also contribute to detaching electrons from negative ions in the beam. This plasma neutralization is especially effective for detaching electrons from negative hydrogen ions, but is not so effective for detaching electrons from F⁻ and Cl⁻ ions.

In some embodiments the neutralizer cell may be filled with a plasma having a sufficient density of electrons of sufficient average energy to have a large cross section for collisionally detaching the extra electron from any negative ion in the beam that passes through said plasma. Said electron density may preferably be greater than about $10^{11}$ electrons/cm$^3$ and said average electron energy may preferably be greater than about 3 eV for H– ion beams and 4 eV for Cl– and F– ions. The gas composition of said plasma in some embodiments is the same as the gas source for forming the negative ion beam. The energetic electrons in the neutralizer in these embodiments have thermal speeds at least an order of magnitude greater than the speed of the negative ions passing through the neutralizer, so that the probability of electron detachment is substantially higher than it would be for negative ions whose speeds are greater than the electron thermal speed passing through this same plasma. This is because the ions spend greater time in the neutralizer region due to their slow speed, and because the thermal energy of electrons in the plasma sufficient for electron impact detachment. Further, if reflective mirrors are employed for a plasma neutralizer as just described the EM radiation from the plasma may be reflected from the peripheral mirrors back into the neutralizer volume so that the radiation may increase the probability of electron detachment from the negative ions in the beam. This may improve the neutral fraction and improve the efficiency of neutral production.

Referring to FIG. 6, the neutralizer cell 600 can be configured to neutralize one or more negative ions using energetic electrons from a neutralizing plasma to generate one or more neutral species for processing a workpiece. The neutralizer cell 600 can be disposed downstream of the grid structure 200 of FIG. 2. In some embodiments, the plasma chamber 100 can be rotatable relative to the neutralizer cell 600 such that the one or more neutral species can process a workpiece at normal incidence or, if desired, at a range of incidence angles differing from normal incidence. In some embodiments, the neutralizer cell 600 can have a depth (e.g. dimension along the direction of travel of a beam through the neutralizer cell 600) in the range of about 10 centimeters to about 100 centimeters. In some embodiments, the neutralizer cell 600 can have a width (e.g. dimension perpendicular to the direction of travel of a beam through the neutralizer cell 600, such as a diameter) in the range of about 40 centimeters to about 60 centimeters. In some embodiments, the neutralizer cell 600 can be substantially cylindrical. For instance, the neutralizer cell 600 can have a substantially circular or elliptical cross-sectional profile.

The neutralizer cell 600 can include one or more magnetic elements 610 disposed around a circumference of the neutralizer cell 600. For example, the one or more magnetic elements 610 can be positioned between a sidewall of the neutralizer cell 600 and a coil 620 used to generate a plasma in the neutralizer cell. The one or more magnetic elements 610 can have any suitable shape and/or configuration. For example, in some embodiments, the one or more magnetic elements 610 can include one or more magnetic bars or rods extending along the depth of the neutralizer cell 600 (i.e. parallel to a central axis defined by a cylindrical neutralizer cell 600).

In some embodiments, the one or more magnetic elements 610 can be configured with alternating polarity. For example, a first magnetic element 610 can be configured such that a north pole of the first magnetic element 610 is proximate and/or faces a first end of the neutralizer cell 600. A second magnetic element 610 that is directly adjacent to the first magnetic element 610 can be configured such that a south pole of the second magnetic element is proximate and/or faces the first end of the neutralizer cell 600. Any other suitable configuration for the one or more magnetic elements 610 can be used in accordance with the present disclosure.

In some embodiments, the one or more magnetic elements 610 can include permanent magnets. In some embodiments, the one or more magnetic elements 610 can include electromagnets.

The one or more magnetic elements 610 can be configured to generate a magnetic field inside the neutralizer cell 600. For example, the magnetic field may be configured to have substantial magnitude near a sidewall of the neutralizer cell 600. Additionally and/or alternatively, the magnetic field may have a magnitude of less than about 10 Gauss in a central volume of the neutralizer cell 600. For example, the magnetic field may be configured to have a magnitude of less than about 10 Gauss in a cylindrical volume perpendicular to the direction of travel of a beam through the neutralizer cell, the cylindrical volume having a diameter of about 350 millimeters. For example, the volume at which the magnetic field has a magnitude of less than about 10 Gauss can be the volume at which a beam can pass through the neutralizer cell 600. In some embodiments, the magnetic field may be a linear multi-cusp magnetic field.

The neutralizer cell 600 can be configured to generate a neutralizing plasma 602. For example, the neutralizer cell 600 can include an antenna 620, such as an electrostatically shielded antenna configured to generate and/or sustain an inductively-coupled neutralizing plasma 602. The antenna 620 can be coupled to an RF source 622. In some embodiments, the antenna 620 can be coupled to the RF source 622 by a suitable matching network 624. The antenna 620 can be disposed around a sidewall of the neutralizer cell 600. For example, the antenna 620 can have a substantially similar shape to the neutralizer cell 600. Any suitable shape and/or configuration of the antenna 620 can be used in accordance with the present disclosure. Additionally and/or alternatively, microwave energy can be used to sustain the neutralizing plasma 602.

The neutralizing plasma 602 can have any suitable composition in accordance with the present disclosure. For example, process gas can be injected into the plasma by one or more inlets (not shown) to generate the neutralizing plasma 602. Such process gas can include hydrogen, chlorine, or fluorine, or compounds thereof such as hydrogen fluoride (HF), nitrogen trifluoride ($NF_3$), hydrogen chloride (HCl), chlorine trifluoride ($ClF_3$), or any other suitable process gas. In some embodiments, one or more vacuum pumps (not shown) may be used to maintain a desired pressure and/or composition of the process gas in the neutralizer cell 600. Additionally and/or alternatively, gas used to generate the neutralizing plasma 602 may pass from the plasma source through a grid structure (e.g. grid structure 200 of FIG. 2) to the interior of neutralizer cell 600 and be ionized within the neutralizer cell 600 to generate and/or sustain the neutralizing plasma 600.

Electrons from the neutralizing plasma 602 can collide with a negative ion in a beam passed through the neutralizer cell 600 to detach the electron from the negative ion. According to some embodiments of the present disclosure, it can be desirable for the neutralizer cell 600 to neutralize ions with high efficiency. For instance, after passing through the neutralizer cell 600, a beam should comprise almost entirely neutral particles, with few to no positive or negative ions. For example, it can be desirable that the product of electron detachment rate and negative ion travel time through the neutralizer cell 600 is at least about two, such as about 4 or more. This can correspond to a remaining fraction of negative ions of less than about $e^{-2}$, such as less than about $e^{-4}$. As another example, it can be desirable that the product of the ionization rate of positive ions and beam travel time through the neutralizer cell 600 be much less than 1, such as about 0.2. Because the cross sections for electron impact detachment of the extra electrons of both F− and Cl− are less than $10^{-15}$ cm$^2$ and the electron energy where the cross sections are maximum is above 30 eV it may be less practical to use a plasma neutralizer for negative fluorine or chlorine beams than for negative hydrogen ion beams since the length and density of such a neutralizer would be much greater than for negative hydrogen ions. One way to improve the efficiency of the plasma neutralizer is to position mirrors for the UV radiation all around the neutralizer plasma region. This causes intense plasma radiation to be reflected back into the negative ion beam which increases the rate of electron detachment. For a sufficiently dense and hot plasma this can substantially improve the rate of detachment and reduce the length of the neutralizer region for negative fluorine or chlorine ions.

According to example embodiments of the present disclosure, a beam passed through the neutralizer cell 600 can be a low-energy beam, such as a beam having energy of less than 100 kiloelectron-volts, such as about 10 electron-volts. For example, the low-energy beam can comprise H− ions that have a high probability of electron detachment in neutralizing plasmas having electrons with an energy of greater than about 6 eV. In this way, the size of the neutralizer cell 600 can be reduced in length relative to plasma neutralizers for higher energy negative ion beams.

Figure 7:
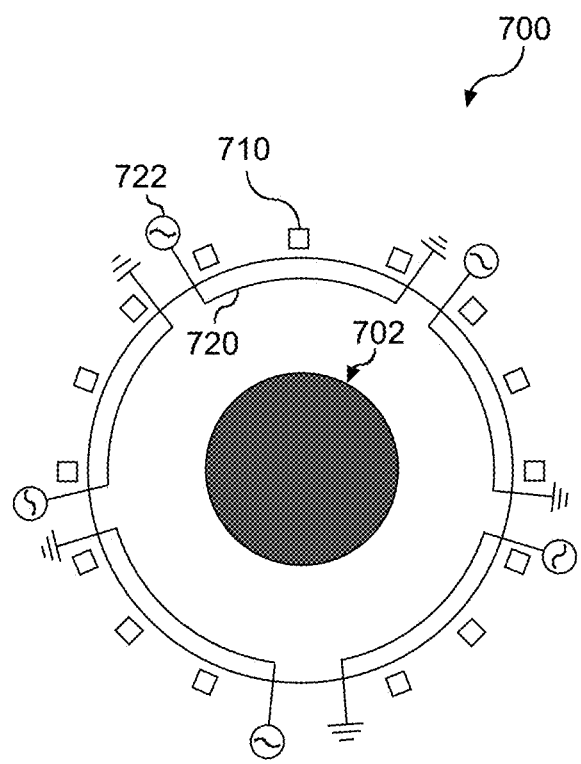
FIG. 7 depicts an example neutralizer cell in a plasma processing system according to example embodiments of the present disclosure.

FIG. 7 depicts an example plasma-based neutralizer cell 700 used in a plasma processing system according to example embodiments of the present disclosure. The neutralizer cell 700 can be used in place of the neutralizer cells shown in FIGS. 3 and 6. Referring to FIG. 7, the neutralizer cell 700 can be configured to neutralize one or more negative ions to generate one or more neutral species for processing a workpiece. The neutralizer cell 700 can be disposed downstream of the grid structure 200 of FIG. 2. In some embodiments, the plasma chamber 100 can be movable (e.g., rotatable) relative to the neutralizer cell 700 such that the one or more neutral species process a workpiece at normal incidence, or at one or more incidence angles. In some embodiments, the neutralizer cell 700 can have a depth (e.g. dimension along the direction of travel of a beam through the neutralizer cell 700) in the range of about 10 centimeters to about 100 centimeters, such as between about 30 cm and 50 cm. In some embodiments, the neutralizer cell 700 can have a width (e.g. dimension perpendicular to the direction of travel of a beam through the neutralizer cell 700, such as a diameter) in the range of about 40 centimeters to about 60 centimeters. In some embodiments, the neutralizer cell 700 can be substantially cylindrical. For instance, the neutralizer cell 700 can have a substantially circular or elliptical cross-sectional profile.

The neutralizer cell 700 can include one or more magnetic elements 710 disposed around a circumference of the neutralizer cell 700. For example, the one or more magnetic elements 710 can be positioned proximate a sidewall of the neutralizer cell. The one or more magnetic elements 710 can have any suitable shape and/or configuration. For example, in some embodiments, the one or more magnetic elements 710 can comprise one or more magnetic bars or rods extending along the depth of the neutralizer cell 700 (i.e. parallel to a central axis defined by a cylindrical neutralizer cell 700).

In some embodiments, the one or more magnetic elements 710 can be configured with alternating polarity. For example, a first magnetic element 710 can be configured such that a north pole of the first magnetic element 710 is proximate a first end of the neutralizer cell 700. A second magnetic element 710 that is directly adjacent to the first magnetic element 710 can be configured such that a south pole of the second magnetic element is proximate the first end of the neutralizer cell 700. Any other suitable configuration for the one or more magnetic elements 710 can be used in accordance with the present disclosure.

In some embodiments, the one or more magnetic elements 710 can include permanent magnets. In some embodiments, the one or more magnetic elements 710 can include electromagnets.

The one or more magnetic elements 710 can be configured to generate a magnetic field mainly near the walls inside the neutralizer cell 700. For example, the magnetic field may be configured to only have substantial magnitude near a sidewall of the neutralizer cell 700. Additionally and/or alternatively, the magnetic field may have a magnitude of less than about 30 Gauss in a central volume of the neutralizer cell 700. For example, the magnetic field may be configured to have a magnitude of less than about 10 Gauss everywhere in a cylindrical volume perpendicular to the direction of travel of a beam through the neutralizer cell, the cylindrical volume having a diameter of about 350 millimeters. In some embodiments, the magnetic field may be a linear multi-cusp magnetic field.

The neutralizer cell 700 can be configured to generate a neutralizing plasma 702. For example, the neutralizer cell 700 can include one or more antennas 720 configured to generate and/or sustain an inductively-coupled neutralizing plasma 702. Each of the one or more antennas 720 can be coupled to each of one or more RF sources 722. In some embodiments, more than one of the one or more antennas 720 can be coupled to the same RF source 722. In some embodiments, the one or more antennas 720 can be coupled to the one or more RF sources 722 by a suitable matching network (not shown). The one or more antennas 720 can be disposed proximate a sidewall, within the neutralizer cell 700. In some embodiments the one or more antennas 720 can extend partially within a sidewall of the neutralizer cell 700. The one or more antennas 720 can wrap substantially along the sidewall of the neutralizer cell 700. For example, the one or more antennas 720 can be disposed entirely outside of the volume of the magnetic field generated by the one or more magnetic elements 710 having a magnitude of about zero. In some embodiments the one or more antennas 720 can be disposed entirely outside of a 350 millimeter cylindrical volume in the center of the neutralizer cell 700 to avoid interfering with a beam passing through the neutralizer cell 700. Any suitable shape and/or configuration of the one or more antennas 720 can be used in accordance with the present disclosure. Additionally and/or alternatively, microwave energy can be used to sustain the neutralizing plasma 702.

The neutralizing plasma 702 can have any suitable composition in accordance with the present disclosure. For example, process gas can be injected into the plasma by one or more inlets (not shown) to generate the neutralizing plasma 702. Such process gas can include hydrogen, chlorine, or fluorine, or compounds thereof such as hydrogen fluoride (HF), nitrogen trifluoride ($NF_3$), hydrogen chloride (HCl), chlorine trifluoride ($ClF_3$), or any other suitable process gas. In some embodiments, one or more vacuum pumps (not shown) may be used to maintain a desired pressure and/or composition of the process gas in the neutralizer cell 700. Additionally and/or alternatively, gas used to generate the neutralizing plasma 702 may pass from a grid structure (e.g. grid structure 200 of FIG. 2) to the interior of neutralizer cell 700 and be ionized within the neutralizer cell 700 to generate and/or sustain the neutralizing plasma 700.

Electrons from the neutralizing plasma 702 can collide with a negative ion in a beam passed through the neutralizer cell 700 to detach the electron from the negative ion. According to some embodiments of the present disclosure, it can be desirable for the neutralizer cell 700 to neutralize ions with high efficiency. For instance, after passing through the neutralizer cell 700, a beam should comprise almost entirely neutral particles, with few to no positive or negative ions. For example, it can be desirable that the product of electron detachment rate and negative ion travel time through the neutralizer cell 700 is at least about two, such as about 4 or more. This can correspond to a remaining fraction of negative ions of less than about $e^{-2}$, such as less than about $e^{-4}$. As another example, it can be desirable that the product of the ionization rate of positive ions and beam travel time through the neutralizer cell 700 is less than one.

According to example embodiments of the present disclosure, a beam passed through the neutralizer cell 700 can be a low-energy beam, such as a beam having energy of less than 10 kiloelectron-volts (keV), such as less than about 1 keV. For example, the low-energy beam can comprise $H^-$, $Cl^-$, and/or $F^-$ ions that have a high probability of electron detachment in neutralizing plasmas having electrons with an energy of greater than about 10 electron-volts. In this way, the size of the neutralizer cell 700 can be substantially reduced over conventional plasma neutralization technologies.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A plasma processing system, comprising:
   a processing chamber having a workpiece support, the workpiece support configured to support a workpiece;
   a plasma source configured to induce a plasma from a process gas in a plasma chamber to generate one or more species of negative ions;
   a grid structure configured to accelerate the one or more negative ions towards the workpiece, the grid structure comprising a first grid plate, a second grid plate, and one or more magnetic elements positioned between the first grid plate and second grid plate to reduce electrons accelerated through the first grid plate;
   a neutralizer cell disposed downstream of the grid structure configured to detach extra electrons from ions of the one or more species of negative ions to generate one or more energetic neutral species for processing the workpiece;
   wherein the neutralizer cell comprises a radiation source, the radiation source comprising one or more lasers configured to emit radiation from the radiation source in one or more bands to detach the extra electrons from the one or more species of negative ions such that a beam of neutral atoms emerges from the neutralizer cell;
   wherein the plasma source is movable relative to the neutralizer cell such that the one or more neutral species process the workpiece at one or more distinct incidence angles.

2. The plasma processing system of claim 1, wherein the plasma source comprises an inductively coupled plasma source.

3. The plasma processing system of claim 1, wherein the process gas comprises hydrogen, chlorine, or fluorine.

4. The plasma processing system of claim 1, wherein the first grid comprises a first plurality of apertures such that the one or more negative ions pass through the first plurality of apertures.

5. The plasma processing system of claim 4, wherein the second grid plate comprises a second plurality of apertures that are aligned with the first plurality of apertures of the first grid plate in such that the one or more negative ions passing through the first plurality of apertures of the first grid plate pass through corresponding apertures of the second plurality of apertures.

6. The plasma processing system of claim 4, wherein a length of the one or more magnetic elements is greater than a length of one of the first plurality of apertures.

7. The plasma processing system of claim 1, wherein a potential difference exists between the first grid and the second grid sufficient to accelerate a plurality of beams of the negative ions.

8. The plasma processing system of claim 1, wherein the plasma source produces a steady state source of negative ions.

9. The plasma processing system of claim 1, wherein the one or more magnetic elements are positioned adjacent the first grid plate such that a length dimension of the one or more magnetic elements is generally perpendicular to a direction of ion extraction and is generally parallel to a plane of the grid structure.

10. The plasma processing system of claim 1, wherein magnetic field strength at one or more pole faces of the one or more magnetic elements is of the order of about 1 kilogauss or less.

11. The plasma processing system of claim 1, wherein material of the one or more magnetic elements comprises ferrites, ceramic magnets, or both.

12. The plasma processing system of claim 1, wherein the neutralizer cell has a depth in the range of about 10 centimeters to 100 centimeters.

13. A plasma processing apparatus, comprising:
a processing chamber having a workpiece support, the workpiece support configured to support a workpiece;
a plasma source configured to induce a plasma from a process gas in a plasma chamber to generate one or more species of negative ions;
a grid structure configured to accelerate the one or more negative ions towards the workpiece, the grid structure comprising a first grid plate, a second grid plate, and one or more magnetic elements positioned between the first grid plate and second grid plate to reduce electrons accelerated through the first grid plate;
a neutralizer cell comprising a radiation source, the radiation source comprising one or more lasers, disposed downstream of the grid structure configured to emit radiation from the radiation source in one or more bands to detach extra electrons from ions of the one or more species of negative ions to such that a beam of neutral atoms emerges from the neutralizer cell;
wherein the plasma source is movable relative to the neutralizer cell such that the one or more neutral species process the workpiece at one or more distinct incidence angles.

14. The plasma processing apparatus of claim 13, wherein the first grid comprises a first plurality of apertures such that the one or more negative ions pass through the first plurality of apertures.

15. The plasma processing system of claim 14, wherein the second grid plate comprises a second plurality of apertures that are aligned with the first plurality of apertures of the first grid plate in such that the one or more negative ions passing through the first plurality of apertures of the first grid plate pass through corresponding apertures of the second plurality of apertures.

16. The plasma processing system of claim 13, wherein a potential difference exists between the first grid and the second grid sufficient to accelerate a plurality of beams of the negative ions.

17. The plasma processing system of claim 13, wherein the one or more magnetic elements are positioned adjacent the first grid plate such that a length dimension of the one or more magnetic elements is generally perpendicular to a direction of ion extraction and is generally parallel to a plane of the grid structure.

\* \* \* \* \*